United States Patent
Kao

(10) Patent No.: US 9,065,448 B2
(45) Date of Patent: Jun. 23, 2015

(54) CAPACITIVE SWITCH HAVING HIGH ACCURACY

(71) Applicant: PIXART IMAGING INC., Hsin-Chu County (TW)

(72) Inventor: Hong-Sing Kao, Hsin-Chu County (TW)

(73) Assignee: Pixart Imaging Inc., Hsin-Chu County (TW)

( * ) Notice: Subject to any disclaimer, the term of this patent is extended or adjusted under 35 U.S.C. 154(b) by 0 days.

(21) Appl. No.: 14/197,342

(22) Filed: Mar. 5, 2014

(65) Prior Publication Data

US 2014/0312962 A1    Oct. 23, 2014

(30) Foreign Application Priority Data

Apr. 17, 2013   (TW) .............................. 102113727 A

(51) Int. Cl.
  *H03K 17/96*   (2006.01)
(52) U.S. Cl.
  CPC .. *H03K 17/9622* (2013.01); *H03K 2217/96072* (2013.01); *H03K 2217/960745* (2013.01)
(58) Field of Classification Search
  CPC ... H03K 17/945; H03K 17/95; H03K 17/955; H03K 17/962; H03K 17/9622; H03K 17/9629
  USPC ................................................. 327/516, 517
  See application file for complete search history.

(56) References Cited

U.S. PATENT DOCUMENTS

| | | | |
|---|---|---|---|
| 8,704,586 B2 * | 4/2014 | Ho et al. ....................... 327/517 |
| 2001/0045803 A1 | 11/2001 | Cencur | |
| 2002/0075053 A1 | 6/2002 | Ganesan | |
| 2008/0001649 A1 | 1/2008 | Cencur | |
| 2008/0224900 A1 | 9/2008 | Konno et al. | |

* cited by examiner

*Primary Examiner* — Hai L Nguyen
(74) *Attorney, Agent, or Firm* — Rosenberg, Klein & Lee

(57) ABSTRACT

There is provided a capacitive switch including a drive circuit, a detection circuit, a reference circuit and an identification unit. The drive circuit inputs identical drive signals to the detection circuit and the reference circuit. The detection circuit detects a touch according to a capacitance variation. The detection circuit outputs a first signal when the touch is not detected and outputs a second signal when the touch is detected. The reference circuit is a replica of the detection circuit and configured to output the first signal. The identification unit identifies a phase shift between the second signal of the detection circuit and the first signal of the reference circuit.

18 Claims, 6 Drawing Sheets

CAPACITIVE SWITCH HAVING HIGH ACCURACY

CROSS REFERENCE TO RELATED APPLICATION

This application claims the priority benefit of Taiwan Patent Application Ser. No. 102113727, filed on Apr. 17, 2013, the full disclosure of which is incorporated herein by reference.

BACKGROUND

1. Field of the Disclosure

This disclosure generally relates to a switch device and, more particularly, to a capacitive switch that may increase the detection accuracy by employing a reference circuit.

2. Description of the Related Art

Conventionally, the switch device uses a mechanical switch to detect the press of a user or the on/off status. However, the conventional mechanical switch may appear poor response due to poor electrical contact or failure due to elastic fatigue of the element after frequent operation.

Therefore, the industry proposed the capacitive switch that can detect the capacitance variation caused by a touch, e.g. detecting the variation of oscillation frequency or charging duration, to accordingly identify whether a touch event occurs or not. However, the electrical deviation may be generated in the conventional capacitance detection circuit due to the variation of manufacturing process, operating voltage and temperature such that misidentification may occur during operation thereby decreasing the operation accuracy.

Accordingly, the present disclosure further provides a capacitive switch whose detection results are compared with the output of a reference circuit so as to eliminate the electrical deviation caused by factors of the manufacturing process and operating environment thereby achieving higher detection accuracy.

SUMMARY

The present disclosure provides a capacitive switch that may eliminate the electrical deviation caused by the manufacturing process, operating voltage and temperature thereby improving the detection accuracy.

The present disclosure provides a capacitive switch that may compare output signals of a detection circuit and a reference circuit thereby improving the detection accuracy.

The present disclosure provides a capacitive switch including a drive circuit, at least one detection circuit, a reference circuit and an identification unit. The drive circuit is configured to output a drive signal. The detection circuit is configured to detect a touch according to a capacitance variation, output a first signal according to the drive signal when the touch is not detected and output a second signal according to the drive signal when the touch is detected. The reference circuit is configured to output the first signal according to the drive signal, wherein the reference circuit is a replica of the detection circuit. The identification unit is configured to output an identified signal according to a phase shift between the second signal of the detection circuit and the first signal of the reference circuit.

The present disclosure further provides a capacitive switch including a drive circuit, a first detection circuit, a second detection circuit, a first identification unit and a second identification unit. The drive circuit is configured to output a drive signal. The first detection circuit and the second detection circuit are replicas of each other and configured to detect a touch according to a capacitance variation, output a first signal according to the drive signal when the touch is not detected and output a second signal according to the drive signal when the touch is detected. The first identification unit is configured to output a first identified signal according to a first phase shift between the second signal of the first detection circuit and the first signal of the second detection circuit. The second identification unit is configured to output a second identified signal according to a second phase shift between the second signal of the second detection circuit and the first signal of the first detection circuit.

The present disclosure further provides a capacitive switch including a control unit, at least one detection circuit, a reference circuit and an identification unit. The control unit is configured to output a drive signal. The detection circuit is configured to detect a touch according to a capacitance variation, and output a detection signal rising edge or a detection signal falling edge at different times according to the drive signal and the capacitance variation. The reference circuit is configured to output a reference signal rising edge or a reference signal falling edge according to the drive signal, wherein the reference circuit is a replica of the detection circuit. The identification unit is configured to identify a phase shift between the detection signal rising edge and the reference signal rising edge or between the detection signal falling edge and the reference signal falling edge, wherein the control unit is further configured to output a control signal according to a comparison result of comparing the phase shift with a threshold.

In one aspect, the identification unit, the first identification unit and the second identification unit include a time to digital converter, a phase detector, a D flip-flop or an AND gate so as to output different identified signals.

In one aspect, the detection circuit, the first detection circuit, the second detection circuit and the reference circuit include a delay extension circuit configured to extend the phase shift generated due to a touch.

In one aspect, the detection circuit and the reference circuit include a comparison unit configured to convert the first signal and the second signal to square signals, wherein the comparison unit may include a slicer, an inverter or a buffer.

In one aspect, the drive circuit may be integrated with a control unit. The control unit is configured to output a control signal according to the identified signal to control an electronic device.

In one aspect, the capacitive switch may include a conductive element for being touched by a user and the conductive element is coupled to the detection capacitor. In this manner, when the user touches the conductive element, the total capacitance is changed thereby changing the output signal of the detection circuit. In another embodiment, the user may also directly touch the capacitor included in the detection circuit so as to induce the capacitance variation.

In the capacitive switch according to the embodiment of the present disclosure, as the detection circuit and the reference circuit are replicas of each other, they have identical variation of electrical characteristics caused by the manufacturing process and operating environment. Therefore, the touch event is identified by comparing the output signal of the detection circuit and the output signal of the reference circuit so as to reduce the misidentification and increase the identification accuracy.

BRIEF DESCRIPTION OF THE DRAWINGS

Other objects, advantages, and novel features of the present disclosure will become more apparent from the following detailed description when taken in conjunction with the accompanying drawings.

DETAILED DESCRIPTION OF THE EMBODIMENT

It should be noted that, wherever possible, the same reference numbers will be used throughout the drawings to refer to the same or like parts.

The present disclosure is related to a capacitive switch configured to detect the capacitance variation induced by the touch of an object (e.g. human body) and correspondingly output a control signal for controlling operating parameters of an electronic device, e.g. including on/off, output, directivity and so on, wherein the electronic device may be home appliances or portable electronic products capable of being controlled by a switch device without particular limitation. The capacitive switch of the present disclosure includes at least one detection circuit and a reference circuit that are replicas of each other, wherein output results of the reference circuit are for being compared with detection results of the detection circuit so as to eliminate the electrical deviation caused by factors of the manufacturing process and operating environment thereby improving the detection accuracy. In the descriptions of the present disclosure, "replica" is referred to the circuit having identical characteristics (e.g. having identical loading) and preferably manufactured by the same process.

Figure 1:
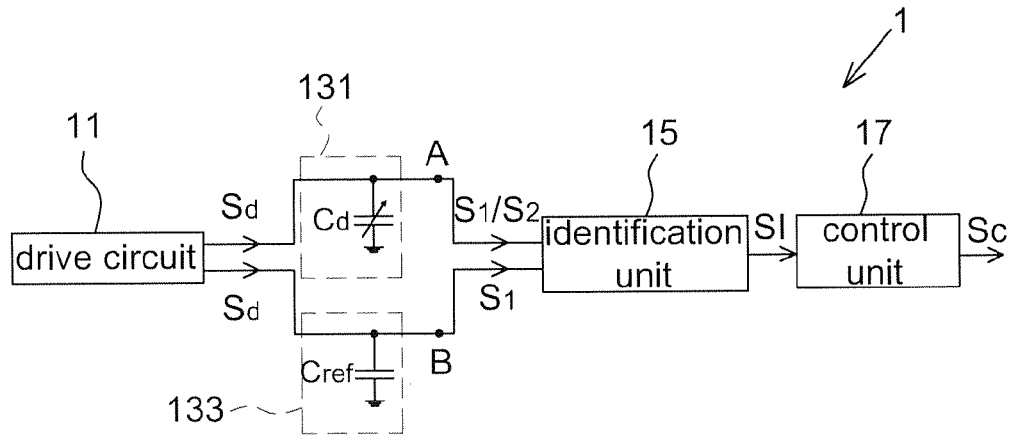
FIG. 1 shows a schematic block diagram of the capacitive switch according to a first embodiment of the present disclosure.

Referring to FIG. 1, it shows a schematic block diagram of the capacitive switch 1 according to a first embodiment of the present disclosure, which includes a drive circuit 11, a detection circuit 131, a reference circuit 133 and an identification unit 15 wherein the reference circuit 133 is a replica of the detection circuit 131.

The drive circuit 11 may include an oscillator or a signal generating circuit configured to periodically output a drive signal Sd, wherein the drive signal Sd may be a square wave, sinusoidal wave, trapezoid wave or triangle wave without particular limitation as long as the drive signal Sd contains the identifiable high voltage level H and low voltage level L. In addition, the drive circuit 11 may output the drive signal Sd with non-fixed period. In this embodiment, the drive circuit 11 may simultaneously input drive signals Sd having identical characteristics, e.g. identical intensity, waveform and phase, into the detection circuit 131 and the reference circuit 133. For example, the detection circuit 131 and the reference circuit 133 simultaneously receive one drive signal Sd, or the drive circuit 11 generates two identical drive signals Sd to be provided to the detection circuit 131 and the reference circuit 133 respectively. In other embodiments, the drive circuit 11 may provide two drive signals having an identical waveform but having a predetermined phase shift to the detection circuit 131 and the reference circuit 133 respectively.

The detection circuit 131 may include a detection capacitor Cd. The drive signal Sd is configured to charge the detection capacitor Cd so as to generate a first signal S1 or a second signal S2, wherein the detection capacitor Cd may be formed by one capacitor or by connecting a plurality of capacitors. More specifically speaking, the detection circuit 131 detects a touch according to a capacitance variation of the detection capacitor Cd. The detection circuit 131 outputs the first signal S1 according to the drive signal Sd when the touch is not detected whereas outputs the second signal S2 according to the drive signal Sd when the touch is detected, wherein the first signal S1 and the second signal S2 are generated by the drive signal Sd charging the detection capacitor Cd. When a touch occurs, the capacitance of the detection capacitor Cd is changed to accordingly change the charging curve of the detection capacitor Cd and cause the phase delay; i.e. the second signal S2 delays the first signal S1 by a phase shift, wherein a value of the phase shift caused by the touch may be determined according to circuit parameters.

The reference circuit 133 includes a reference capacitor Cref, which may or may not have the same capacitance value as the detection capacitor Cd. In the embodiment of the present disclosure, the reference capacitor Cref has the same capacitance value as the detection capacitor Cd. In the present disclosure, as the reference circuit 133 is not used to detect the touch event, when the drive signal Sd charges the reference capacitor Cref, only the first signal S1 is generated but the second signal S2 is not generated. More specifically speaking, the reference circuit 133 outputs the first signal S1, which is identical to the first signal S1 outputted by the detection circuit 131, according to the charging of the drive signal Sd to the reference capacitor Cref. As the reference circuit 133 is for being compared with the detection circuit 131, the present disclosure detects a touch according to the capacitance variation of the detection circuit 131 and the reference circuit 133 may be embedded inside the chip.

The identification unit 15 is coupled to the detection circuit 131 and the reference circuit 133 and configured to output an identified signal SI (described exemplarily below) according to a phase shift between the second signal S2 of the detection circuit 131 and the first signal S1 of the reference circuit 133.

Figure 2A:
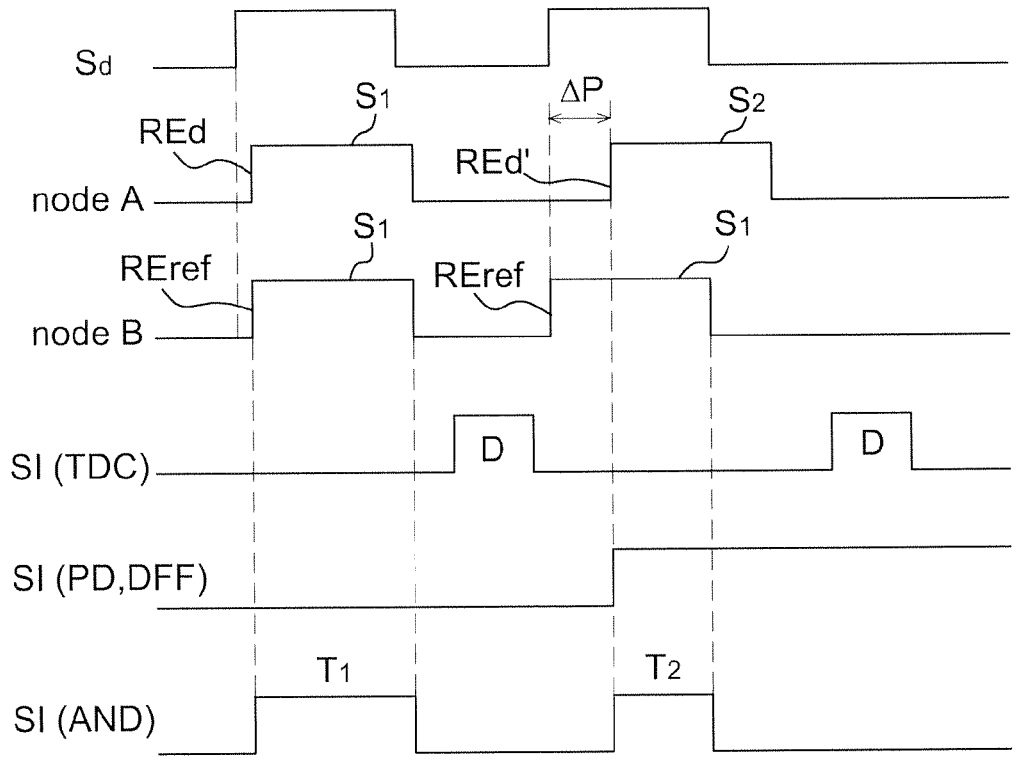
FIGS. 2A-2C show operational schematic diagrams of the capacitive switch of FIG. 1.

FIG. 2A shows an operational schematic diagram of the capacitive switch of FIG. 1. Please referring to FIGS. 1 and 2A, the drive circuit 11 periodically outputs a drive signal Sd, wherein for illustration purpose, the drive signal Sd is shown as a square wave herein, but as mentioned above the drive signal Sd is not limited to the square wave. When a touch is not detected, the detection circuit 131 outputs a first signal S1 according to the drive signal Sd; whereas when the touch is detected, the detection circuit 131 outputs a second signal S2 according to the drive signal Sd, wherein the second signal S2 delays the first signal S1 by a phase shift ΔP (e.g. the signal shown on the node A). The reference circuit 131 outputs the first signal S1 (e.g. the signal shown on the node B) according to the drive signal Sd.

Figure 2B:
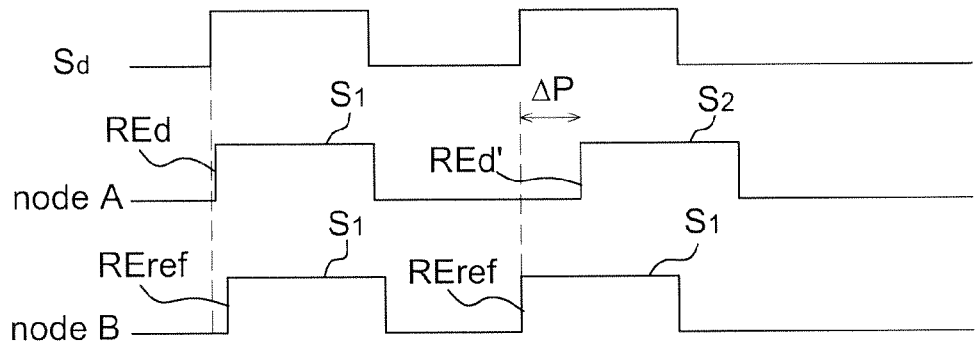
Figure 2C:
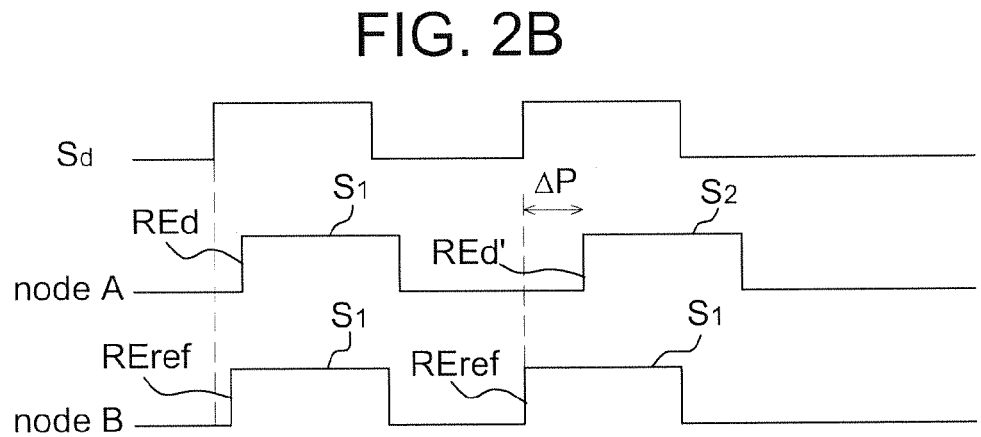

For example, the first signal S1 outputted by the detection circuit 131 has a detection signal rising edge REd and the second signal S2 outputted by the detection circuit 131 has a detection signal rising edge REd'. The first signal S1 outputted by the reference circuit 133 has a reference signal rising edge REref. In one embodiment, when the detection circuit 131 does not detect a touch, the detection signal rising edge REd and the reference signal rising edge REref does not have a phase shift; and when the detection circuit 131 detects the touch, the detection signal rising edge REd' and the reference signal rising edge REref has a phase shift ΔP. It should be mentioned that according to different drive signals Sd, the detection signal rising edge and the reference signal rising edge may be replaced by the detection signal falling edge and the reference signal falling edge respectively. More specifically speaking, in this embodiment the detection circuit 131 may output a rising edge or a falling edge of the detection signal at different times according to the drive signal Sd and the capacitance variation (due to the touch), and the reference circuit 133 may output a rising edge or a falling edge of the reference signal according to the drive signal Sd. The identification unit 15 then identifies a phase shift ΔP between the detection signal rising edge and the reference signal rising edge or between the detection signal falling edge and the reference signal falling edge so as to output an identified signal SI. In addition, referring to FIGS. 2B and 2C, when the detection circuit 131 does not detect a touch, the first signals S1 on the node A and the node B may have some phase shift. For example, FIG. 2B shows that the detection signal rising edge REd leads the reference signal rising edge REref by a small phase difference, whereas FIG. 2C shows that the detection signal rising edge REd lags the reference signal rising edge REref by a small phase difference. When the detection circuit 131 detects the touch, an obvious phase shift between the detection signal rising edge REd' and the reference signal rising edge REref is induced such that the identification unit 15 may identify the occurrence of the touch event accordingly.

The capacitive switch 1 of the present disclosure may further include a control unit 17 configured to output a control signal Sc according to the identified signal S1. For example, the control unit 17 may output the control signal Sc to an electronic device according to a comparison result of comparing the phase shift ΔP with a threshold so as to perform the corresponding control, wherein the threshold may be determined according to the required sensitivity.

In on embodiment, the drive circuit 11 and the control unit 17 may be disposed separately but coupled electrically. In another embodiment, the drive circuit 11 may be integrated in the control unit 17 such that the control unit 17 may have the function of the drive circuit 11, e.g. outputting the drive signal Sd to charge the detection capacitor and the reference capacitor, and may output the control signal Sc according to the identified signal S1.

The identification unit 15 may output different identified signals SI according to different embodiments. In this embodiment, the identification unit 15 may include a time to digital converter (TDC), a phase detector (PD), a D flip-flop (DFF) or an AND gate configured to identify the phase shift ΔP.

Referring to FIG. 2A again, when the identification unit 15 includes the time to digital converter (TDC), the identification unit 15 may output a digital data D containing information of the phase shift ΔP according to the phase shift ΔP to be served as the identified signal S1, and the digital data D may have 2 bits, 4 bits and so on without particular limitation. If the identification unit 15 includes the phase detector (PD) or the D flip-flop (DFF) and when the identification unit 15 identifies the presence of the phase shift ΔP, a signal level is changed (e.g. from High to Low or from Low to High) to be served as the identified signal SI; whereas when the identification unit 15 identifies the absence of the phase shift ΔP, the signal level is maintained. When the identification unit 15 includes the AND gate, the identification unit 15 may output signals having different signal durations, e.g. T1 and T2 shown in FIG. 2A, according to different phase shifts ΔP to be served as the identified signal SI. It should be mentioned that the timing sequence of every signal in FIG. 2A is not limited to that shown therein. FIG. 2A is only intended to illustrate that the identification unit 15 may output different identified signals SI according to different embodiments but the present disclosure is not limited thereto.

Figure 3:
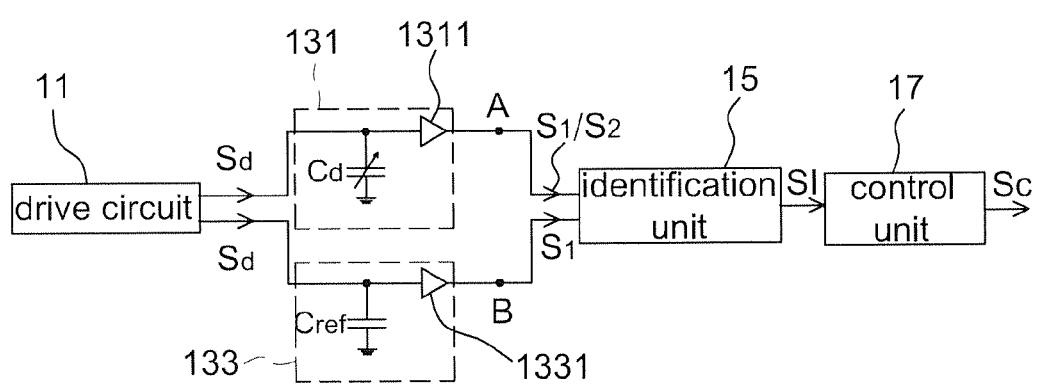
FIG. 3 shows another schematic block diagram of the capacitive switch according to the first embodiment of the present disclosure, which includes a comparison unit.

Referring to FIG. 3, it shows another schematic block diagram of the capacitive switch 1 according to the embodiment of the present disclosure. As mentioned above, as the drive signal Sd does not have particular limitation, the detection circuit 131 and the reference circuit 133 may respectively further include a comparison unit 1311 and 1331 configured to convert the first signal S1 and the second signal S2 to square signals (as shown in FIG. 2A) such that the phase shift ΔP between the rising/falling edge of the detection signal and the rising/falling edge of the reference signal may be identified easily, wherein the comparison unit 1311 and 1331 may respectively include a slicer, an inverter or a buffer. In addition, operations of other elements are similar to those of FIG. 1 and thus details thereof are not described herein.

Figure 4:
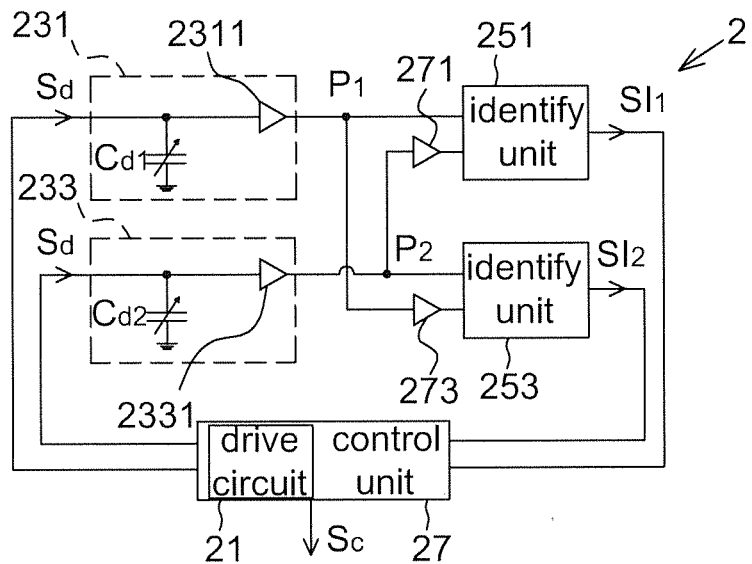
FIG. 4 shows a schematic block diagram of the capacitive switch according to a second embodiment of the present disclosure.

Referring to FIG. 4, it shows a schematic block diagram of the capacitive switch 2 according to a second embodiment of the present disclosure, which includes a first detection circuit 231, a second detection circuit 233, a first identification unit 251, a second identification unit 253 and a control unit 27, wherein the control unit 27 herein includes a drive circuit 21. In other embodiments the drive circuit 21 may not be integrated in the control unit 27 (as shown in FIG. 1). In this embodiment, the first detection circuit 231 is shown to include a first detection capacitor Cd1 and a first comparison unit 2311; and the second detection circuit 233 is shown to include a second detection capacitor Cd2 and a second comparison unit 2331. As mentioned above the first comparison unit 2311 and the second comparison unit 2331 may not be implemented. The difference between the second embodiment and the first embodiment is that in the second embodiment the two detection capacitors Cd1 and Cd2 may both be used to detect a touch. More specifically speaking, when the object touches the first detection circuit 231, the second detection circuit 233 is served as a reference circuit of the first detection circuit 231, and vise versa. Accordingly, in the second embodiment the first detection circuit 231 and the second detection circuit 233 are replicas of each other. As mentioned above, the identification units 251 and 253 may respectively include a time to digital converter (TDC), a phase detector (PD), a D flip-flop (DFF) or an AND gate. In addition, the capacitive switch 2 may further include a first inverter 271 and a second inverter 273 coupled to one of the input terminals of the identification units 251 and 253 to be served as a phase delay element such that electrical signals on the nodes P1 and P2 may have a small phase difference to avoid identification error. It is appreciated that said phase delay element may not use the inverter.

Figure 5:
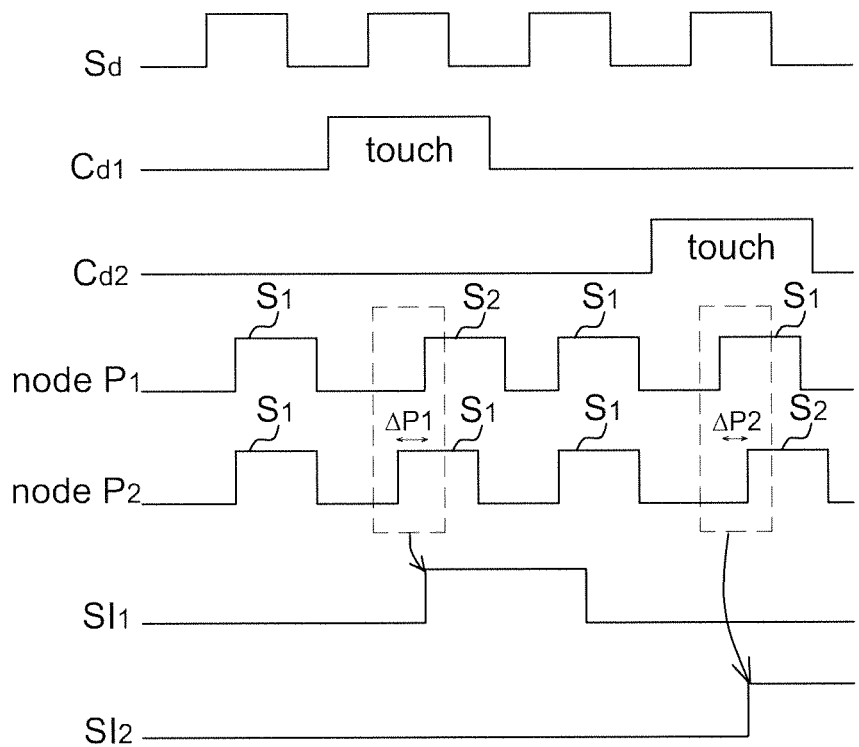
FIG. 5 shows an operational schematic diagram of the capacitive switch of FIG. 4.

FIG. 5 shows an operational schematic diagram of the capacitive switch 2 of FIG. 4. Please referring to FIGS. 4 and 5, the control unit 27 (or the drive unit 21) may output identical drive signals Sd to the first detection circuit 231 and the second detection circuit 233. The first detection circuit 231 and the second detection circuit 233 are configured to detect a touch respectively according to the capacitance variation of the first detection capacitor Cd1 and the second detection capacitor Cd2. For example FIG. 5 respectively shows the capacitance variation caused by the object in contact with the first detection capacitor Cd1 and the second detection capacitor Cd2. In this embodiment, when the first detection circuit 231 and the second detection circuit 233 do not detect the touch, a first signal S1 is outputted according to the drive signal Sd; whereas when the first detection circuit 231 and the second detection circuit 233 detect the touch, a second signal S2 (e.g. signals shown on the node P1 and the node P2) is outputted according to the drive signal. The first identification unit 251 is configured to output a first identified signal SI1 according to a first phase shift ΔP1 between the second signal S2 of the first detection circuit 231 and the first signal S1 of the second detection circuit 233. The second identification unit 253 is configured to output a second identified signal SI2 according to a second phase shift ΔP2 between the second signal S2 of the second detection circuit 233 and the first signal S1 of the first detection circuit 231. As mentioned above, the first phase shift ΔP1 and the second phase shift ΔP2 may be the phase difference between the detection signal rising edges or between the detection signal falling edges.

As mentioned above, according to different embodiments the first identification unit 251 and the second identification unit 253 may respectively include a time to digital converter, a phase detector, a D flip-flop or an AND gate so as to output different identified signals SI1 and SI2 (as shown in FIG. 2A).

As mentioned above, the first comparison unit 2311 and the second comparison unit 2333 are configured to convert the first signal S1 and the second signal S2 to square signals such that the phase shifts ΔP1 and ΔP2 between the rising/falling edge of the detection signal and the rising/falling edge of the reference signal may be identified easily, wherein the comparison units 2311 and 2333 may respectively include a slicer, an inverter or a buffer.

The control unit 27 then outputs a control signal Sc according to the first identified signal SI1 or the second identified signal SI2 to an electronic device for performing the corresponding control. It is appreciated that as the first detection circuit 231 and the second detection circuit 233 are replicas of each other in order to increase the detection accuracy, preferably the first detection circuit 231 and the second detection circuit 233 do not detect the touch at the same time. For example in one embodiment, the control unit 27 may not output the control signal Sc when the first detection circuit 231 and the second detection 233 detect a touch simultaneously.

Figure 6:
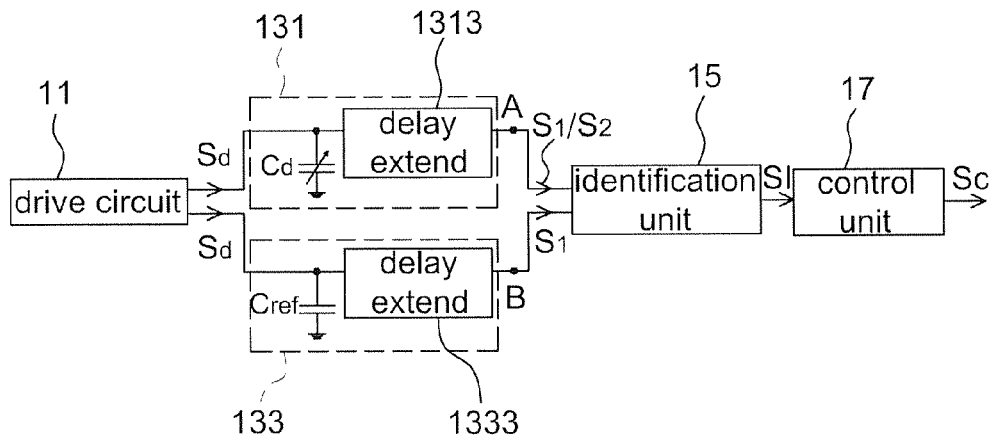
FIG. 6 shows another schematic block diagram of the capacitive switch according to the first embodiment of the present disclosure, which includes a delay extension unit.

Referring to FIG. 6, it shows another schematic block diagram of the capacitive switch 1 according to the embodiment of the present disclosure. In order to increase the identification sensitivity, in the present disclosure a delay extension unit 1313 and 1333 may be respectively disposed in the detection circuit 131 and the reference circuit 133 configured to extend the phase shift ΔP between the second signal S2 of the detection circuit 131 and the first signal S1 of the reference circuit 133. The operations of other elements are similar to those of FIG. 1 and thus details thereof are not repeated herein. In should be mentioned that although FIG. 6 is illustrated by using the first embodiment, the delay extension unit may also be applied to the second embodiment of the present disclosure.

Figure 7A:
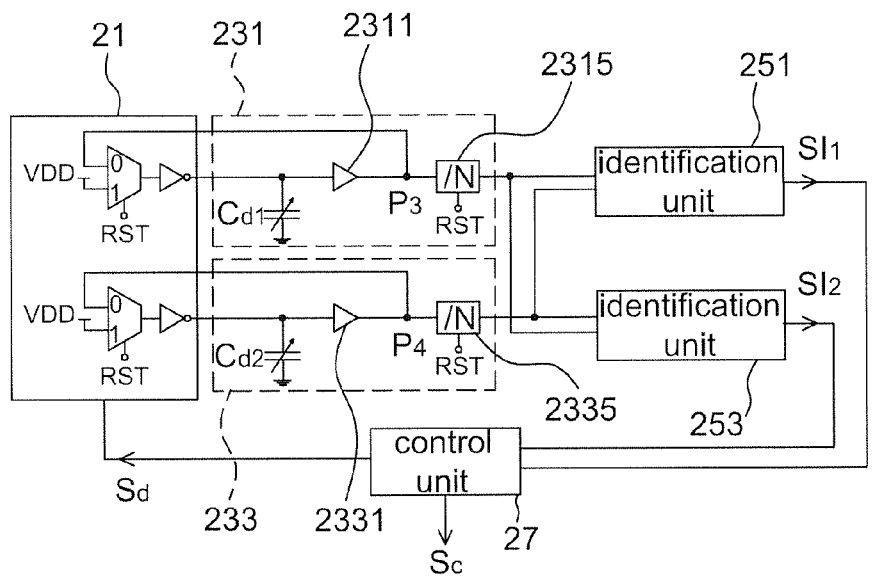
FIG. 7A shows another schematic block diagram of the capacitive switch according to the second embodiment of the present disclosure, which includes a delay extension unit.

For example referring to FIG. 7A, it shows the second embodiment of the present disclosure in which the first detection circuit 231 and the second detection circuit 233 respectively include a delay extension unit configured to extend the first phase shift ΔP1 and the second phase shift ΔP2 respectively. In this embodiment, the delay extension unit is configured to feedback the first signal S1 and the second signal S2 outputted by the first detection circuit 231 and the second detection circuit 233 to the drive circuit 21. The first detection circuit 321 and the second detection circuit 233 may include the delay line. The first phase shift ΔP1 and the second phase shift ΔP2 are extended by feeding the first signal S1 and the second signal S2 to repeatedly pass through the delay line.

Figure 7B:
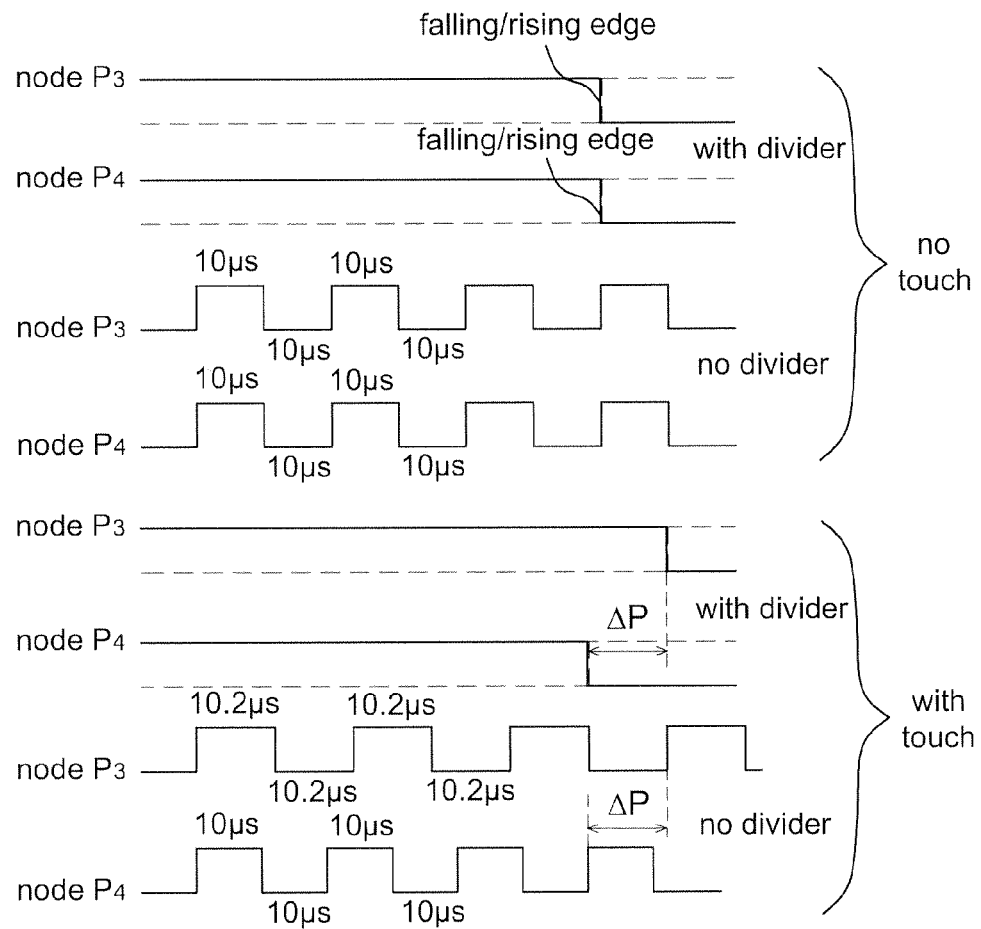
FIG. 7B shows an operational schematic diagram of the capacitive switch of FIG. 7A.

Referring to FIG. 7B, it shows an operational schematic diagram of the capacitive switch 2 of FIG. 7A. When the first detection circuit 231 and the second detection circuit 233 are not touched by the object (no touch), signals on the nodes P3 and P4 may have periods of 20 μs (10 μs signal duration). When the first detection circuit 231 is touched by the object (with touch), due to the capacitance variation the signal on the node P3 may have a period of 20.4 μs (10.2 μs signal duration) and the signal on the node P4 may still have the period of 20 μs (10 μs signal duration). Therefore, the first identification unit 251 may output a first identified signal SI1 according to a phase shift ΔP between the output signal (e.g. node P3) of the first detection circuit 231 and the output signal (e.g. node P4) of the second detection circuit 233. As mentioned above, the first identification unit 251 identifies the presence of a touch even only when the phase shift ΔP is larger than a threshold.

In another embodiment, in order to allow the phase shift between the rising/falling edges of the detection signals each time outputted by the first detection circuit 231 and the second detection circuit 233 to be more obvious, the delay extension units of the first detection circuit 21 and the second detection circuit 233 may respectively further include a divider 2315 and 2355 configured to perform the division operation on the feedbacked first signal S1 and the feedbacked second signal S2. For example referring to FIG. 7B, it shows the operation of the dividers 2315 and 2335 having a divisor equal to 4. For example when the first detection circuit 321 and the second detection circuit 233 are not touched by the object (no touch), the rising/falling edges of the detection signals on the nodes P3 and P4 outputted from the dividers 2315 and 2335 do not have a phase shift. When the first detection circuit 231 is touched by the object (with touch), the rising/falling edges of the detection signals on the nodes P3 and P4 outputted from the dividers 2315 and 2335 have the phase shift ΔP. The first identification unit 251 may also output a first identified signal SI1 according to the phase shift ΔP between the output signal of the first detection circuit 231 and the output signal of the second detection circuit 233.

It should be mentioned that if the second detection circuit 233 in FIG. 7A is not used to detect the object touch, the second detection circuit 233 has the same function as the reference circuit 133 of FIG. 1 and thus the second identification unit 253 may not be implemented. In other words, the delay extension unit of FIG. 7A may also be applied to FIG. 1 configured to feedback the first signal S1 and the second signal S2 outputted by the detection circuit 131 to the drive circuit 11 and feedback the first signal S1 outputted by the reference circuit 133 to the drive circuit 11. The delay extension circuit may also include a divider configured to perform the division operation on the feedbacked first signal S1 and the feedbacked second signal S2 of the detection circuit 231 and perform the division operation on the feedbacked first signal S1 of the reference circuit 233.

Figure 8:
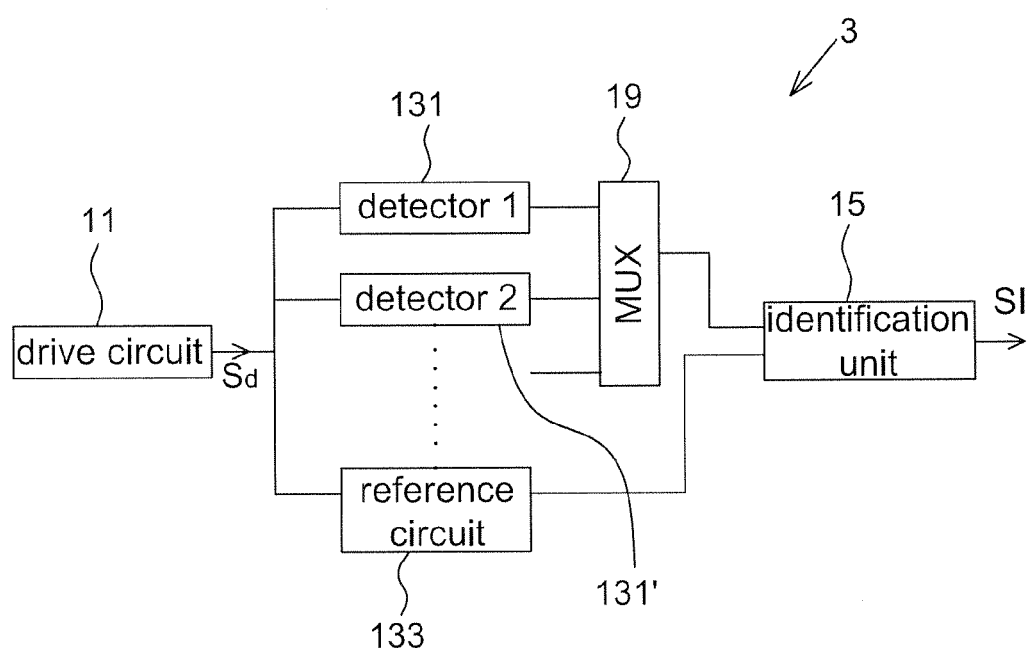
FIG. 8 shows a schematic block diagram of the capacitive switch according to a third embodiment of the present disclosure, which includes a plurality of detection circuits.

In addition, the capacitive switch 1 of the present disclosure may include one reference circuit and a plurality of detection circuits for being applied to a plurality of switch devices. For example referring to FIG. 8, it shows a schematic block diagram of the capacitive switch 3 according to a third embodiment of the present disclosure, which includes a plurality of detection circuits 131, 131' . . . and a reference circuit 133 being replicas of each other, wherein each of the detection circuits 131, 131'... and the reference circuit 133 may be implemented according to FIGS. 1, 3 and 6-7. The detection circuits 131, 131'... may be coupled to the identification unit 15 through a multiplexer 19. Accordingly, the identification unit 15 may sequentially compare a phase shift between the second signal S2 of each of the detection circuits 131, 131'... and the first signal S1 of the reference circuit 133 so as to output an identified signal (as shown in FIG. 2A). In other words, the capacitive switch according to the embodiment of the present disclosure may include at least one detection circuit and a reference circuit being replicas of each other, wherein methods of the drive circuit 11 outputting the drive signal Sd and the identification unit 15 identifying the phase shift between output signals of each of the detection circuits 131, 131'... and the reference circuit 133 are similar to those of the first embodiment and thus details thereof are not repeated herein.

As mentioned above, the conventional capacitance detection circuit has low detection accuracy due to the variation of circuit characteristics. Therefore, the present disclosure further provides a capacitive switch (FIGS. 1, 3, 4, 6, 7A and 8) that has two detection circuits being replica of each other, wherein when one of the two detection circuits is detecting a touch, the other one is served as a reference circuit. As the two detection circuits are exactly identical, the circuit characteristics also change identically thereby eliminating the misidentification caused by the variation of circuit characteristics.

Although the disclosure has been explained in relation to its preferred embodiment, it is not used to limit the disclosure. It is to be understood that many other possible modifications and variations can be made by those skilled in the art without departing from the spirit and scope of the disclosure as hereinafter claimed.

What is claimed is:

1. A capacitive switch, comprising:
   a drive circuit configured to output a drive signal;
   at least one detection circuit configured to detect a touch according to a capacitance variation, output a first signal according to the drive signal when the touch is not detected and output a second signal according to the drive signal when the touch is detected;
   a reference circuit configured to output the first signal according to the drive signal, wherein the reference circuit is a replica of the detection circuit; and
   a time to digital converter configured to output an identified signal according to a phase shift between the second signal of the detection circuit and the first signal of the reference circuit.

2. The capacitive switch as claimed in claim 1, further comprising a control unit configured to output a control signal according to the identified signal.

3. The capacitive switch as claimed in claim 1, wherein the detection circuit and the reference circuit comprise a delay extension unit configured to extend the phase shift.

4. The capacitive switch as claimed in claim 3, wherein the delay extension unit is configured to feedback the first signal and the second signal outputted by the detection circuit to the drive circuit.

5. The capacitive switch as claimed in claim 4, wherein the delay extension unit comprises a divider configured to perform the division operation on the feedbacked first signal and the feedbacked second signal.

6. The capacitive switch as claimed in claim 1, wherein the detection circuit and the reference circuit comprise a comparison unit configured to convert the first signal and the second signal to square signals.

7. The capacitive switch as claimed in claim 6, wherein the comparison unit comprises a slicer, an inverter or a buffer.

8. The capacitive switch as claimed in claim 1, wherein when comprising a plurality of detection circuits, the capacitive switch further comprises a multiplexer coupled between the detection circuits and the time to digital converter.

9. A capacitive switch, comprising:
   a drive circuit configured to output a drive signal;
   a first detection circuit and a second detection circuit being replicas of each other and configured to detect a touch according to a capacitance variation, output a first signal according to the drive signal when the touch is not detected and output a second signal according to the drive signal when the touch is detected;
   a first time to digital converter configured to output a first identified signal according to a first phase shift between the second signal of the first detection circuit and the first signal of the second detection circuit; and
   a second time to digital converter configured to output a second identified signal according to a second phase shift between the second signal of the second detection circuit and the first signal of the first detection circuit.

10. The capacitive switch as claimed in claim 9, wherein the first detection circuit and the second detection circuit comprise a delay extension unit configured to extend the first phase shift and the second phase shift respectively.

11. The capacitive switch as claimed in claim 10, wherein the delay extension unit is configured to feedback the first signal and the second signal outputted by the first detection circuit and the second detection circuit to the drive circuit.

12. The capacitive switch as claimed in claim 11, wherein the delay extension unit comprises a divider configured to perform the division operation on the feedbacked first signal and the feedbacked second signal.

13. The capacitive switch as claimed in claim 9, wherein the first detection circuit and the second detection circuit comprise a comparison unit configured to convert the first signal and the second signal to square signals.

14. The capacitive switch as claimed in claim 13, wherein the comparison unit comprises a slicer, an inverter or a buffer.

15. The capacitive switch as claimed in claim 9, further comprising a control unit configured to output a control signal according to the first identified signal or the second identified signal.

16. A capacitive switch, comprising:
    a control unit configured to output a drive signal;
    at least one detection circuit configured to detect a touch according to a capacitance variation, and output a detection signal rising edge or a detection signal falling edge at different times according to the drive signal and the capacitance variation;
    a reference circuit configured to output a reference signal rising edge or a reference signal falling edge according to the drive signal, wherein the reference circuit is a replica of the detection circuit; and
    a time to digital converter configured to identify a phase shift between the detection signal rising edge and the reference signal rising edge or between the detection signal falling edge and the reference signal falling edge,
    wherein the control unit is further configured to output a control signal according to a comparison result of comparing the phase shift with a threshold.

17. The capacitive switch as claimed in claim 16, wherein the time to digital converter comprises a time to digital converter, a phase detector, a D flip-flop or an AND gate configured to identify the phase shift.

18. The capacitive switch as claimed in claim 16, wherein the detection circuit and the reference circuit respectively comprise a slicer, an inverter or a buffer configured to respectively output the detection signal rising edge or the detection signal falling edge and the reference signal rising edge or the reference signal falling edge.

\* \* \* \* \*